(12) United States Patent
Peets

(10) Patent No.: US 7,883,368 B2
(45) Date of Patent: Feb. 8, 2011

(54) HOOK END FOLDING ELECTROMAGNETIC COMPATIBILTY GASKET

(75) Inventor: Michael T. Peets, Staatsburg, NY (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 12/273,020

(22) Filed: Nov. 18, 2008

(65) Prior Publication Data
US 2010/0124846 A1 May 20, 2010

(51) Int. Cl.
H01R 13/648 (2006.01)
(52) U.S. Cl. .................................. 439/607.18
(58) Field of Classification Search ............ 439/607.18; 361/818; 174/351, 345, 35 C
See application file for complete search history.

(56) References Cited

U.S. PATENT DOCUMENTS 6,646,197 B1 * 11/2003 Cugalj et al. ................. 174/355
6,660,932 B1 * 12/2003 Barringer et al. ............ 174/358
6,924,988 B2 * 8/2005 Barringer et al. ............ 361/818

* cited by examiner

Primary Examiner—Alexander Gilman
(74) Attorney, Agent, or Firm—Jose Gutman; Fleit Gibbons Gutman Bongini & Bianco PL

(57) ABSTRACT

An electromagnetic compatibility ("EMC") gasket includes a first conductive portion moveable to a plurality of positions. A secondary conductive portion is connected to the first conductive portion at an adjacent edge. A third conductive portion is opposite the secondary conductive portion such that the first portion is between the second and third portions. The third conductive portion is connected to the first conductive portion at an adjacent edge. The third conductive portion is curved creating a hook structure such that when in a housing the third conductive portion engages a portion of the housing. This engagement causes the first conductive portion of the EMC gasket to fold and/or flex as an electronic card is moved within the housing in a lateral direction while the housing is disposed stationary in a chassis to mate a connector on the electronic card with a connector in the chassis.

20 Claims, 5 Drawing Sheets

HOOK END FOLDING ELECTROMAGNETIC COMPATIBILTY GASKET

CROSS REFERENCE TO RELATED APPLICATION

The present patent application is also related to co-pending and commonly owned U.S. patent application Ser. No. 11/947,248, entitled "Collapsible EMC Gasket", which is hereby incorporated by reference in its entirety.

FIELD OF THE INVENTION

The present invention generally relates to the field of packaging computing systems, and more particularly relates to an electromagnetic compatibility sealing apparatus used in computing system environments.

BACKGROUND OF THE INVENTION

The industry trend has been to continuously increase the number of electronic components inside computing systems. Unfortunately, while the number of these components is increased, the foot print of these systems remains the same or is even reduced. This is because installation, transportation and storage issues of the consumers have to be addressed. Lighter, and more compact systems are often more attractive to potential consumers. Unfortunately, storing many components in a tight footprint, despite its many advantages, also creates challenges for the designer of these systems. Moreover, while increasing the components inside a simple computing system does create some challenges, such an increase in larger more sophisticated system environments create even greater problems.

A particularly challenging area for the designers of these systems is the issue of resolving electromagnetic interference ("EMI"). Every device or component emits a certain amount of electromagnetic radiation, also referred to as electromagnetic leakage. However, as the number of components is increased, electromagnetic leakage concerns continue to grow. In larger system environments, where the components are packaged in close proximity to one another, the increased number of components and the system footprint greatly increases the EMI concerns since the leakage from one device can greatly affect the proper function of a close by component.

Consequently, unresolved EMI leakage can affect system performance, data integrity and speed of the entire system environment. This is because while such effects can be tolerated when few devices and components exist, the increasing number of components and devices can seriously impact system integrity and performance. In addition, many recent semiconductor devices that operates at higher speeds, cause even greater electromagnetic emission in higher frequency bands where interference is more likely to occur. Therefore a need exists to overcome these problems.

SUMMARY OF THE INVENTION

In one embodiment an electromagnetic compatibility ("EMC") gasket is disclosed. The EMC gasket includes a first conductive portion moveable to a plurality of positions. A second conductive portion is mechanically coupled to the first conductive portion at an adjacent edge of the first conductive portion. A third conductive portion is disposed on an opposite side of the second conductive portion such that the first portion is disposed between the second and third conductive portions. The third conductive portion is mechanically coupled to the first conductive portion at an adjacent edge. The first conductive portion, the second conductive portion, and the third conductive portion comprise a flexible material. The third conductive portion is curved creating a hook structure such that when disposed in contact with a housing the third conductive portion engages a portion of the housing. This engagement causes the first conductive portion to fold and/or flex as an electronic card module comprising the EMC gasket is blindly moved in a direction while the housing, which comprises the electronic card, is disposed in a chassis to mate a connector in the electronic card module with another connector in the chassis thereby maintaining an electrical contact with the housing.

In another embodiment, an electronic card is disclosed. The electronic card module includes a front portion and a back portion that is situated opposite the front portion. The electronic card module also includes a first side portion and a second side portion that is situated opposite the first side portion. An EMC gasket is mechanically coupled to the front portion. The EMC gasket is situated on the front portion in an offset configuration such that a first portion of the EMC gasket is at a first given distance from the first side portion and a second portion of the EMC gasket extends a second given distance beyond the second side portion. Wherein the EMC gasket is comprised of a flexible conductive sheet. At least one connector is situated toward the back portion and at the first side portion, wherein the at least one connector includes mateable members facing the first side portion.

In yet another embodiment, an electronic card includes a front portion and a back portion that is situated opposite the front portion. The electronic card module also includes a first side portion and a second side portion that is situated opposite the first side portion. At least one connector is situated toward the back portion and at the first side portion. The at least one connector includes mateable members facing the first side portion. An EMC gasket includes a first conductive portion that is disposed on the second side portion substantially near the front portion. The first conductive portion is moveable to a plurality of positions. A second conductive portion of the EMC gasket is mechanically coupled to the first conductive portion at an edge of the first conductive portion adjacent to the second side portion. A first part of the second conductive portion is situated at the first side portion and a second part of the second conductive portion is situated at the second side portion. A third conductive portion is disposed on an opposite side of the secondary conductive portion such that the first portion is disposed between the second and third conductive portions. The third conductive portion is mechanically coupled to the first conductive portion at an adjacent edge. The first conductive portion, the second conductive portion, and the third conductive portion comprise a flexible material.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

DETAILED DESCRIPTION

Figure 1:
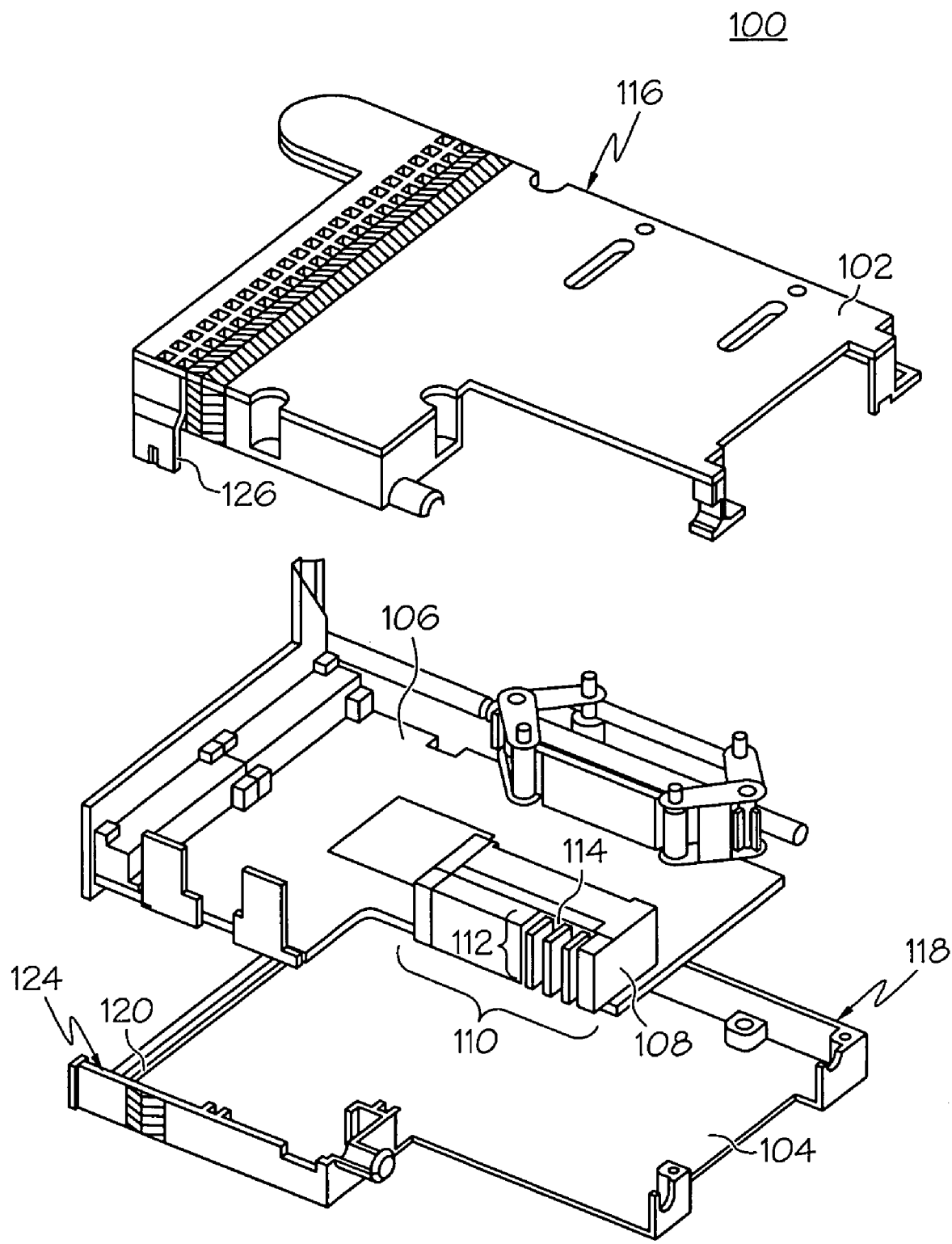
FIG. 1 is a side perspective exploded view of a computer housing assembly used for housing electronic boards and cards according to one embodiment of the present invention.

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

EMC Gasket

As discussed above, electrical devices or components emit electromagnetic radiation, which left unresolved can affect system performance, data integrity and speed of the entire system environment. One way to address or minimize electromagnetic interference is through electromagnetic shielding. Electromagnetic shielding is the process of limiting the flow of electromagnetic fields between two locations, by separating them with a barrier made of conductive material. In addition, proper device operation and electromagnetic compatibility ("EMC") requires that emissions from a given device be reduced by shielding or other similar means. Such shieldings are designed not only to reduce emissions from the device itself, but also to reduce sensitivity of the device to external fields such as fields from other devices. One type of such EMI shielding comprises EMI gaskets.

In many computing system environments, a metallic type of electromagnetic gasket is used to contain EMC emissions in an electrical enclosure in which a device having a printed circuit board or card assembly is engaged. In these cases, while the EMC emissions need to be contained when this card is plugged, it is desired for the gasket to be designed such as to allow the card to retract back into its housing prior to plugging or when the card is removed from the system. Unfortunately, the prior art does not provide adequate solutions to allow for the easy retraction and removal of the card. However, as is discussed in greater detail below, the various embodiments of the present invention overcome these problems by presenting an EMC gasket that is configured to fold, flex, and make contact with a housing comprising an electronic card on all edges. Because of the shape that is made when the gasket is installed in the housing the gasket is allowed to slide and fold and flex back on itself.

Figure 2:
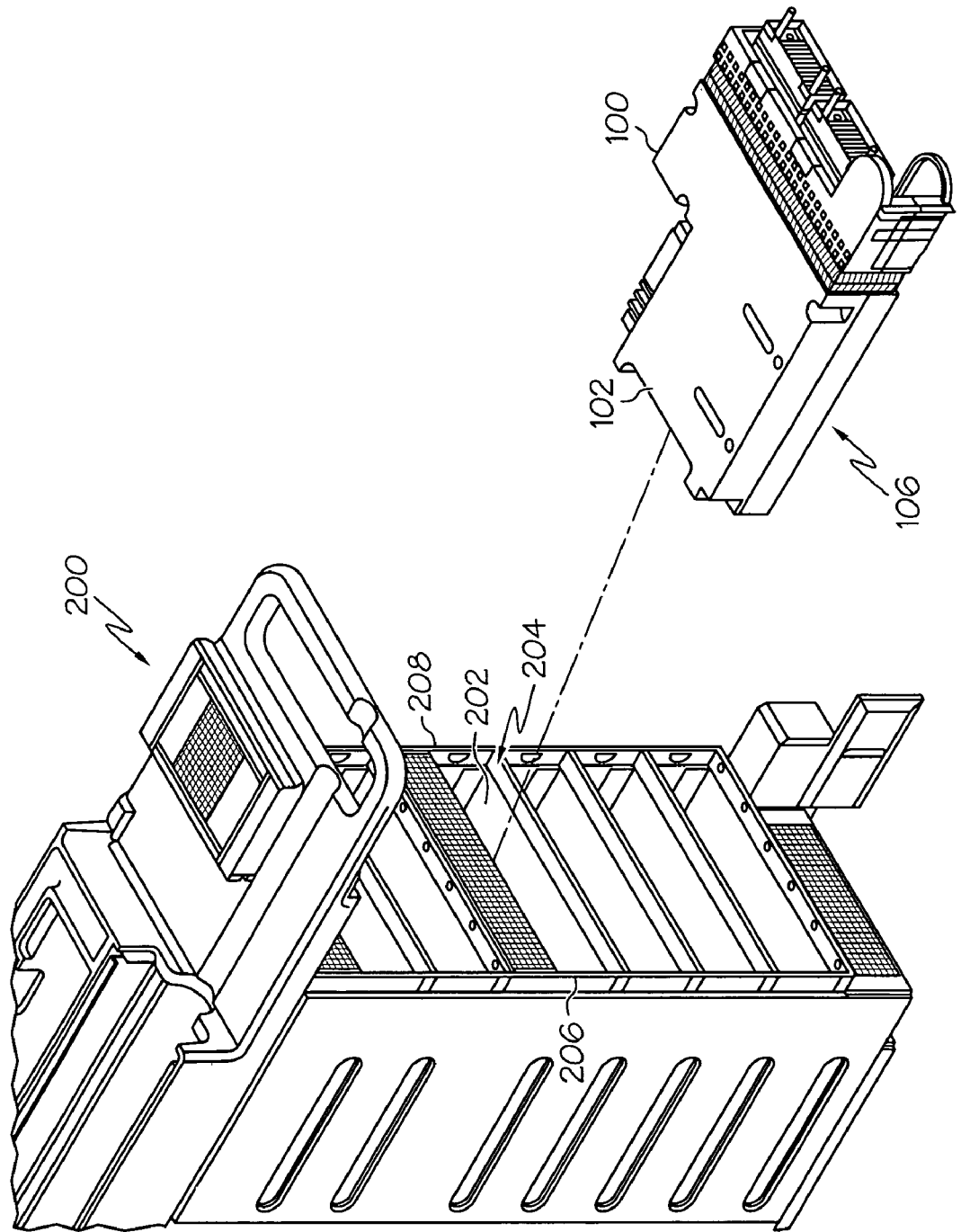
FIG. 2 is a schematic illustrating a rack/chassis for receiving the housing of FIG. 1 according to one embodiment of the present invention.
Figure 3:
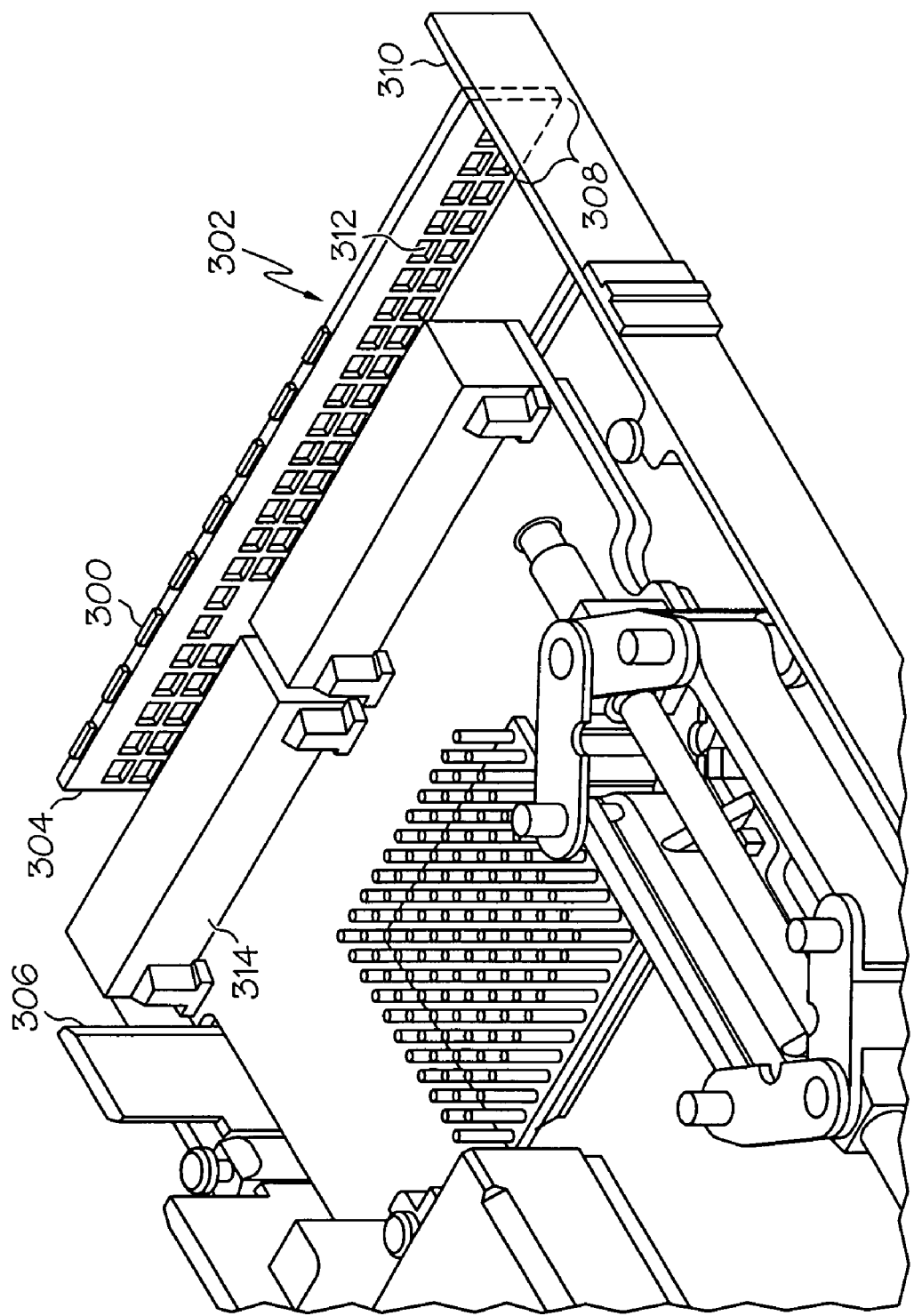
FIG. 3 is a side perspective view of an electronic card comprising an EMC gasket according to one embodiment of the present invention.

FIG. 1 is a side perspective exploded view of an electronic card housing assembly 100 used for housing electronic boards and cards. In one embodiment, the housing 100 can be comprised of a plurality of sections 102, 104. The electronic card housing assembly 100 includes a top cover 102 a bottom 104 cover, and an electronic card 106. It should be noted that both the top cover 102 and bottom cover 104 are not required. For example, in one embodiment, only the top cover 102 is used, while in another embodiment, only the bottom cover 104 is used in conjunction with the electronic card 106. Even further, the housing 100 can only include the electronic card 106 with an EMC gasket 300 (FIG. 3). In this embodiment the top cover 102 and the bottom cover 104 are not required. The housing 100 including the card/board 106 can further be disposed or placed in a computer rack, chassis and/or frame 200, as shown in FIG. 2, such as used in connection with very large and complex computing system environments. For example, FIG. 2 shows a rack/chassis 200 configured to receive the housing 100 comprising an electronic card or board.

In one embodiment, the electronic card 106 includes at least one connector 108. However, it should be noted that this connector 106 can also be disposed on either the top cover 102 or the bottom cover 104 and then mechanically coupled to the card 106. The connector 108 is situated toward a back portion 110 of the electronic card 106. The connector 108 comprises a mating section 112 that includes mateable members 114 situated in an outward facing configuration with respect to the electronic card 106. This outward facing configuration of the mateable members 114 allows the connector 108 to mate with a connector (not shown) in the rack/chassis 200 when the card 106 is moved in a lateral (e.g., a horizontal) direction within the housing 100 while the housing 100 is inside the rack/chassis 200. However, in an alternative embodiment, the housing 100 can be inserted into the rack/chassis 200 in such a way that connector 108 mates with a connector in the rack/chassis 200 when a vertical movement is applied to card 106 while the housing 100 is inside the card 106 inside the housing 100, such as lateral (e.g., horizontal) and vertical, is only used as an example and does not limit the present invention in any way.

In one embodiment, the housing 100 is configured to be inserted into a slot 202 within the rack/chassis 200 and then the card 106 moved in a lateral direction inside the housing 100. For example, the housing 100 can include a lever (not shown) or other mechanism that when pushed, pulled, turned, or the like (i.e., when actuated) causes the card 106 to move in a given direction within the housing 100 in the rack/chassis 200. This movement, in one embodiment, causes the mateable members 114 to engage mateable members of a connector within the rack/chassis 200. This can be referred to as a blind connection because the user generally inserts the housing 100 into the rack/chassis 200 in a first direction and "blindly" moves the card 106 in a second direction to mate the connector 108 to a connector within the rack/chassis 200.

In order to ensure proper operation of the computing device, EMC emissions of the electronic components need to be contained once the electronic card 106 in the housing 100 is mated to a corresponding connector within the rack/chassis 200. Therefore, in one embodiment, the housing 100 includes an EMC gasket 300 that is configured to flex to allow the electronic card to retract back into its housing 100 prior to plugging or when the card is removed from the computing system environment. The EMC gasket 300 is also configured to maintain the EMC containment as the card 106 is moved in a second direction that is perpendicular to (or more generally different from) the first direction to mate the connector 108 on the electronic card 106 to a connector within the rack/chassis 200.

For example, FIG. 3 shows a side perspective view of the electronic card 106 coupled to the lower housing cover 104 comprising an EMC gasket 300. In particular, FIG. 3 shows an EMC gasket 300 situated at a front portion 302 (a portion that faces the opening of the slot 202) of the electronic card 106. In this embodiment, a first portion 304 of the EMC gasket 300 is situated a given distance from an edge 306 of the electronic card 106. This distance is defined by how far the housing 100 of the electronic card 106 is required to travel in the second direction to mate the connector 108 with a connector in the rack/chassis 200. For example, after the card 106 has moved in the second direction to mate the connector 108 with the connector in the rack/chassis 200 the EMC gasket 300 is configured to create an EMC seal around the outside of the slot 204 where the housing 100 was inserted. However, because the card 106 needs to travel in the second direction to mate the connector 108 with the connector in the rack/chassis 200, the EMC gasket 300 needs to be dimensioned to compensate for the movement in the second direction, as shown in FIG. 3.

A second portion 308 of the EMC gasket 300 extends beyond the opposite edge 310 of the electronic card 106. When the housing 100 is inserted into the rack/chassis 200 in the first direction, this extending portion 308 extends beyond an outside edge 206 (or 208) of the slot 202 (as shown in FIG. 2). However, because the EMC gasket 300 is fabricated from a flexible material, the EMC gasket 300 flexes and/or folds accordingly. For example, the gasket 300 including the overlapping portion pushes against the outside edges 206/208 of the slot 202. As the card 106 is moved in the second direction to mate the connector 108 with the connector in the rack/chassis 200 the extending portion 308 of the gasket 300 becomes substantially flush with an outside edge of the slot 202. Stated differently, the EMC gasket 300 is offset on the electronic card 106 to compensate for the movement in the first and second directions so that a seal can be created with the slot 202 of the rack/chassis 200 once the connector 108 is mated to the connector within the rack/chassis 200. It should be noted that in this embodiment, the second portion 308 of the EMC gasket 300 extends beyond an outer portion 116 of the top housing cover 102 and an outer portion 118 of the bottom housing cover 104 as well.

The EMC gasket 300 also includes a plurality of apertures 312. These apertures 312 allow air to flow in and out of the housing 100. The EMC gasket 300 can be mechanically coupled to the electronic card 106 using various fastening mechanisms. For example, FIG. 3 shows the EMC gasket 300 mechanically coupled to one or more I/O interfaces 314 using a screw, bolt, rivet, or the like. The EMC gasket 300 can also be welded to the electronic card 106 as well. It should be understood to those of ordinary skill in the art that additional fastening mechanisms can be used to couple the EMC gasket 300 to the electronic card 106. In one embodiment, the EMC gasket 300 is formed of a conductive material such as metal and/or plastic and is fabricated to be flexible. In one embodiment, the gasket 300 is fabricated of a flexible metal sheet that can be disposed compressed a first to a second position when force is applied on it. In this embodiment, a material with good material memory so that the gasket can be released back to its original shape (substantially) after compression.

Figure 4:
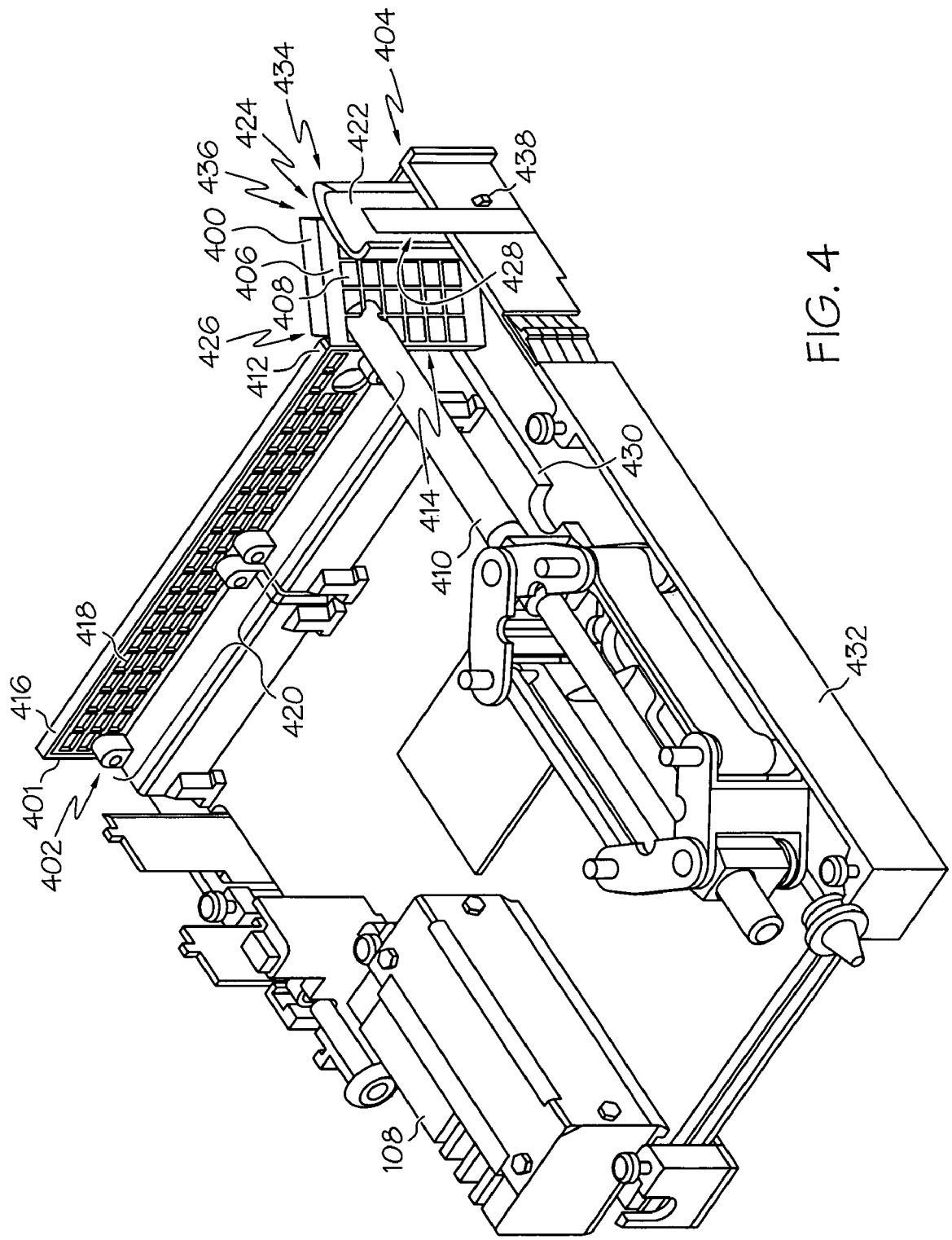
FIG. 4 is a side perspective view of an electronic card comprising another EMC gasket according to one embodiment of the present invention.

FIG. 4 shows another example of an EMC gasket 400. In particular, FIG. 4 shows a side perspective view of the electronic card 106 coupled to the lower housing cover 104. In this embodiment, the EMC gasket 400 is disposed on an outside portion 402 of the electronic card 106. The EMC gasket 400 is situated at one corner side 404 of the electronic card 106 as shown. The gasket 400 is formed of a conductive material and is fabricated to be flexible and is fabricated with characteristics that allow the gasket 400 to flex in a way as to allow a plugged-in card 106 to travel back and forth in the housing 100 (which can comprise of only the electronic card 106 and optionally one or more of the covers 102, 104). In other words, in this embodiment, a user inserts the housing 100 into the rack/chassis in a first direction and the card/board within the housing 100 travels in a second direction (so that the connector 108 mates to another connector) that is perpendicular to first direction while the housing 100 remains stationary. The EMC gasket 400 comprises a hook shaped end 434 that couples to the lower housing cover 104 and/or the upper housing cover 102 (when used) so that the gasket 400 folds and/or flexes as the card/board 106 travels in the second direction within the housing 100. This allows the EMC gasket 400 to make contact with the housing 100 on all edges.

The gasket 400 comprises of a plurality of conductive portions. The first conductive portion 406 is configured to enable movement from a first to a second position to accommodate a housing including a card to be removed or plugged as necessary. In this embodiment, this first conductive portion 406 is fabricated with apertures 408 to help maintain its light weight characteristics, to enhance moveability, and to allow airflow in/out of the housing 100. The apertures 408, as shown can be used to further secure the gasket 400 to the electronic card 106 by using an optional rod 410. The optional rod 410, which is in turn connected to the electronic card 106, can be used to further facilitate the movement of the first conductive portion 406 from a first to a second position. In one embodiment, the gasket 400 or at least the first conductive portion 406 can also be secured to the electronic card 106 at to one or more edges of the card 106 (and/or covers 102, 104). It is also possible to even provide hinge like structures 412 at one or more edges 414 of the first conductive portion 406 as shown to further enhance motion of this portion 406.

To enhance EMC, the first conductive portion 406 can be connected to a secondary conductive portion 416. The second conductive portion 416 is coupled to the first conductive portion 406 on a side 426 away from the corner 404 of the housing lower housing cover 104. The second conductive portion 416 can be stationary in one embodiment and fabricated specifically to enhance EMC (and can also be flexible similar to the configuration of the gasket 300 in FIG. 3). In this embodiment, this second conductive portion 416 is secured to the outside edge 402 of the electronic card 106 and is be compatible with covers 102, 104 if they are used. The second conductive portion 416 slides within a track (not shown) disposed on a corresponding portion of the top cover of the housing 100 when the electronic card 106 is moved within the housing 100, as discussed above. An additional conductive portion (not shown) disposed directly opposite and parallel to the second conductive portion slides within a track 120 disposed on the bottom cover 104 of the housing 100 when the electronic card 106 is moved within the housing 100, as discussed above. As the gasket 400 moves within the housing 100 from a first position to a second position an edge 401 of the gasket 400 situated substantially near or on the outside portion 402 of the electronic card 106 is compressed against an outer wall 122 of the top cover 102 and/or an outer wall 124 of the bottom cover 126 of the housing 100 creating a seal.

To address weight issues, air flow, and to enhance the EMC further, the second conductive portion 416 is also fabricated to include a plurality of apertures 418 as shown. The second conductive portion 416 is secured to the electronic card 106 by a variety of means as known to those skilled in the art. The apertures 418 can be used to enhance and provide for securing means. In addition holes and other means can be provided on the housing, if desired to aid in securing the second conductive portion 416 to the electronic card 106 if desired.

In one embodiment, the second conductive portion 416 of the gasket 400 is fabricated to match the length of the side 420 of the housing that it is to be disposed on. This has been done to enhance EMC, but it is possible to selectively change the length of this portion 416 such that the portion 416 is shorter or alternatively even longer than the length of the housing edge 420 that the second conductive portion 416 is being disposed on selectively. A third conductive portion 422 is situated on the opposing side 424 of the first conductive portion 406 such that the third conductive portion 422 is closer to the side corner 404 of the housing 100. In this configuration, the first conductive portion 406 is then situated between the second conductive portion 416 on one side 426 and the third conductive portion 422 on the other side 424. In one embodiment, the third conductive portion 422 is curved also in structure and is provided to enhance flexibility of the gasket 400 and to provide a spring like feature to the portion 422. The curved portion 422 (i.e., the third conductive portion 422) is disposed between the first conductive portion 406 and the side 428 of the lower housing cover 104 such that it provides a wedge as illustrated. The curved portion 422 is then disposed inside the housing 100 when an upper cover 102 and/or a lower cover 104 is used in conjunction with the electronic card 106. In particular, the curved portion 422 is situated between an outer edge 430 of the electronic card 106 and the inner side 428 of an outer portion 432 of the lower housing cover 104 (is similarly situated with respect to the upper housing cover 102). The curved portion 422 is disposed against the first conductive portion 406 in a manner such that it creates a hook configuration 434 for the first conductive portion 402 when viewed from a top down view.

The curved third conductive portion 422 is also secured to the lower housing cover 104 on one side 428 and to the first and second conductive portions 406, 422 of the gasket 400 on the other side 438. Securing/fastening mechanisms as known to those skilled in the art can be used to achieve this objective. It is possible, however, to have this portion 422 of the gasket 400 coupled to the lower housing cover 104 and the other conductive portions 406, 416 of the gasket 400 in substantially the same side. For example, an edge 438 where the third and first gasket portions 406, 422 come together allow for the third conductive portion 422 to be coupled to the lower housing cover 104 and the other conductive portions 406, 416 in substantially the same side. A fastening mechanism(s) 439 is also provided to separately secure the gasket 400 to the electronic card 106. While this enhances the securing means, other alternative embodiments are possible.

In this embodiment, the other side of the third gasket portion 422 is unsecured which helps the curved portion to be compressed and decompressed as the first portion is moved from a first to a second and back to the first position as the card is plugged and unplugged or as the housing 100 in general is disposed and removed from a larger environment such as a computer frame or rack. It should be noted that all portions 406, 416, 422 of the gasket 400 are fabricated to be compatible with the design of the electronic card 106 and the upper and lower covers 102, 106 when applicable. Also, ridges or other design features can be added to enhance such compatibility or to further enhance the securing of the gasket 400 to the electronic card 106 (and optionally one or more of the covers 102, 104). It should be noted that when the covers 102, 104 are implemented, the gasket 400 continually interfaces with the covers 102, 104 at portions 416, 426 (and equivalent features on the opposite side of the gasket 400 not shown in FIG. 4) and also on the side 422. When the electronic card 106 is actuated to mate with a connector inside a chassis 200 a portion (not shown) of the gasket 400 near the outside portion 402 interfaces with the covers 102, 104 a well.

Figure 5:
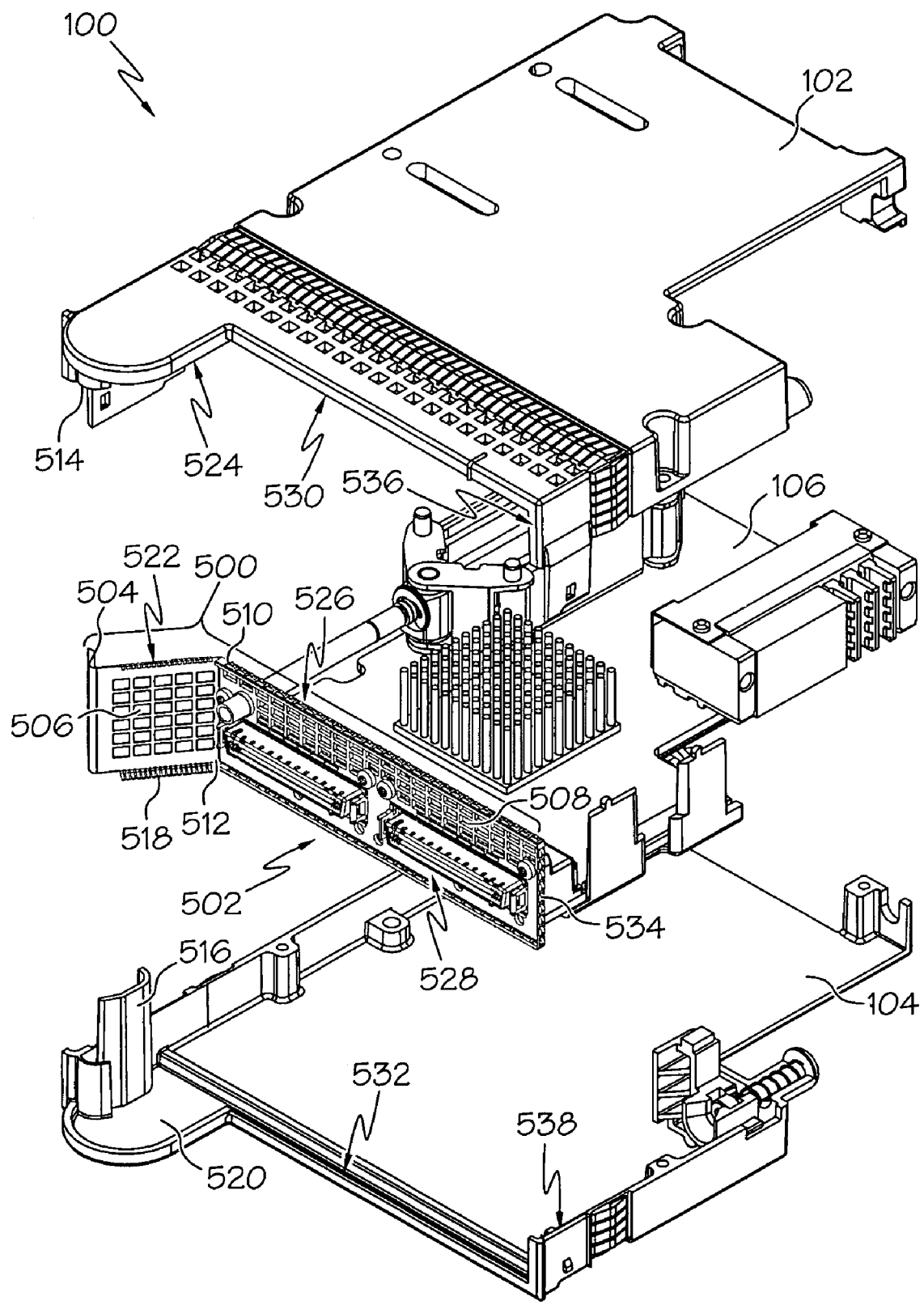
FIG. 5 is a front perspective exploded view of the housing assembly of FIG. 1, according to one embodiment of the present invention.

FIG. 5 shows a front perspective exploded view of the electronic card housing assembly 100 of FIG. 1. In particular, FIG. 5 shows the upper housing 102, lower housing 104, and the electronic card 106 discussed above. The EMC gasket 500 is coupled to an outside portion 502 of the electronic card 106. A first portion 504 of the EMC gasket is substantially curved and extends from a second portion 506 of the EMC gasket 500. The second portion 506 of the EMC gasket 500 is coupled to a third portion 508 of the EMC gasket 500 at one or more flex points 510, 512. The first, second, and third portions 504, 506, 508 of the EMC gasket 500, in one embodiment, are conductive. The first portion 504 and the second portion 506 of the EMC gasket 500 are configured to flex and/or pivot as the electronic card 106 moves relative to the housing covers 102, 104. For example, the first portion 504 can act as a wedge against corresponding portions 514, 516 of the upper and/or lower housings 102, 104, respectively. This wedge formation allows the first portion 504 to remain substantially in place as the portion 504 flexes/pivots such that the second portion 506 of the gasket 500 can flex/pivot about its flex points 510, 512 so that the card 106 can travel within the housing assembly 100. In the example of FIG. 5, the card 106 moves from the left side of the figure to the right side of the figure.

As the card 106 moves in a lateral direction within the housing assembly 100, a bottom portion 518 of the second portion 506 of the EMC gasket 500 engages a corresponding portion 520 of the lower housing cover 106 while an upper portion 522 of the second portion 506 of the EMC gasket 500 engages a corresponding portion 524 of the upper housing cover 106. Upper and lower portions 526, 528 of the third portion 508 of the EMC gasket 500 travel within a corresponding upper track 530 of the upper housing cover 102 and a corresponding lower track 532 of the lower housing cover 104, respectively, as the card 106 travels within the housing assembly 100. As the card 106 moves within the housing assembly 100, an outer portion 534 of the gasket 500, which is situated on an opposite end of the gasket 500 as the first portion 504, becomes compressed against an inside surface of an outer wall 536, 538 of the upper housing cover 102 and the lower housing cover 104. This creates and maintains a complete EMC seal around the portion of the housing assembly 100 comprising the EMC gasket 500 of the card 106, even while the card 106 travels within the housing assembly 100.

Non-Limiting Examples

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. An assembly comprising:
a housing including an electronic card;
the electronic card comprising:
a front portion;
a back portion situated opposite the front portion;
a first side portion;

a second side portion situated opposite the first side portion;

an electromagnetic compatibility ("EMC") gasket mechanically coupled to the front portion, wherein the EMC gasket is situated on the front portion in an offset configuration such that a first portion of the EMC gasket is at a first given distance from the first side portion and a second portion of the EMC gasket extends a second given distance beyond the second side portion, and wherein the EMC gasket is comprised of a flexible conductive sheet; and at least one connector situated toward the back portion and at the first side portion, wherein the at least one connector includes mateable members facing the first side portion.

2. The assembly of claim 1, wherein the EMC gasket folds and/or flexes as the housing comprising the electronic card is inserted into a chassis in a first direction maintaining electrical contact with the housing.

3. The assembly of claim 1, wherein the second portion of the EMC gasket is configured to overlap an outside edge of a housing comprising the electronic card when the housing is inserted into a slot of the chassis in a first direction.

4. The assembly of claim 3, wherein the electronic card is configured such that the electronic card is moved in a second direction that is different than the first direction while the housing is disposed in the slot of the chassis for mating a connector in the electronic card with a connector in the chassis.

5. The assembly of claim 4, wherein the electronic card is mechanically coupled to a moving member that when actuated moves the electronic card in the second direction.

6. The assembly of claim 4, wherein mateable members of the connector in the electronic card mate with mateable members of the connector in the chassis when the electronic card is moved in the second direction.

7. The assembly of claim 4, wherein the EMC gasket creates a complete seal around an outside opening of the housing when the electronic card has been moved in the second direction such that the connector in the electronic card is mated with the connector in the chassis, the EMC gasket maintaining an electrical contact with the housing.

8. An electronic card module comprising:
a front portion;
a back portion situated opposite the front portion;
a first side portion;
a second side portion situated opposite the first side portion; and
at least one connector situated toward the back portion and at the first side portion, wherein the at least one connector includes mateable members facing the first side portion; and
an electromagnetic compatibility ("EMC") gasket comprising:
a first conductive portion disposed on the second side portion substantially near the front portion, wherein the first conductive portion is moveable to a plurality of positions;
a second conductive portion mechanically coupled to the first conductive portion at an edge of the first conductive portion adjacent to the second side portion, wherein a first portion of the second conductive portion is situated at the first side portion and a second portion of the second conductive portion is situated at the second side portion; and
a third conductive portion disposed on an opposite side of the secondary conductive portion such that the first portion is disposed between the second and third conductive portions, wherein the third conductive portion is mechanically coupled to the first conductive portion at an adjacent edge,
wherein the first conductive portion, the second conductive portion, and the third conductive portion, comprise a flexible material.

9. The electronic card module of claim 8, wherein the second conductive portion is substantially stationary.

10. The electronic card module of claim 8, wherein the EMC gasket folds and/or flexes as a housing comprising the electronic card module is inserted into a chassis in a first direction, maintaining electrical contact with the housing.

11. The electronic card module of claim 10, wherein the electronic card module is configured such that the electronic card module is moved within the housing in a second direction that is different than the first direction while the housing is disposed in the slot of the chassis for mating a connector in the electronic card module with a connector in the chassis.

12. The electronic card module of claim 11, wherein mateable members of the connector in the electronic card module mate with mateable members of the connector in the chassis when the electronic card module is moved in the second direction.

13. The electronic card module of claim 11, wherein the EMC gasket creates a complete seal around an outside opening of the housing when the electronic card module has been moved in the second direction such that the connector in the electronic card module is mated with the connector in the chassis, the EMC gasket maintaining an electrical contact with the housing.

14. The electronic card module of claim 11, wherein the third conductive portion is curved creating a hook structure such that when the electronic card module is disposed in the housing the third conductive portion engages a portion of the housing thereby causing the first conductive portion to fold and/or flex as the electronic card module is blindly moved in the second direction maintaining an electrical contact with the housing.

15. An electromagnetic compatibility ("EMC") gasket comprising:
a first conductive portion moveable to a plurality of positions;
a secondary conductive portion mechanically coupled to the first conductive portion at an adjacent edge of the first conductive portion, and
a third conductive portion disposed on an opposite side of the secondary conductive portion such that the first portion is disposed between the second and third conductive portions, wherein the third conductive portion is mechanically coupled to the first conductive portion at an adjacent edge,
wherein the first conductive portion, the second conductive portion, and the third conductive portion comprise a flexible material, and
wherein the third conductive portion is curved creating a hook structure such that when disposed in a housing comprising an electronic card module the third conductive portion engages a portion of the housing thereby causing the first conductive portion to fold and/or flex as the electronic card module comprising the EMC gasket is blindly moved in a direction to mate a connector on the electronic card module with another connector in a chassis thereby maintaining an electrical contact with the housing.

16. The EMC gasket of claim 15, wherein the second conductive portion is stationary.

17. The EMC gasket of claim 15, wherein the EMC gasket folds and/or flexes as the housing is inserted into a chassis in a first direction, maintaining electrical contact with the housing.

18. The EMC gasket of claim 15, wherein the first conductive portion, the second conductive portion, and the third conductive portion EMC create a complete seal around an outside edge of the housing maintaining an electrical contact with the housing when the housing, which comprises the electronic card module comprising the EMC gasket, is disposed in the chassis slot.

19. The EMC gasket of claim 15, wherein at least one of the first conductive portion, second conductive portion, and third conductive portion comprises apertures.

20. The EMC gasket of claim 15, wherein the first conductive portion, second conductive portion, and third conductive portion comprise at least one of:

a flexible conductive metal; and a flexible conductive plastic.

* * * * *